(12) United States Patent  (10) Patent No.: US 8,519,410 B1
Odekirk et al.  (45) Date of Patent: Aug. 27, 2013

(54) SILICON CARBIDE VERTICAL-SIDEWALL DUAL-MESA STATIC INDUCTION TRANSISTOR

(75) Inventors: Bruce Odekirk, Bend, OR (US); Francis K. Chai, Bend, OR (US); Edward William Maxwell, Redmond, OR (US); Douglas C. Thompson, Jr., Bend, OR (US)

(73) Assignee: Microsemi Corporation, Bend, OR (US)

( * ) Notice: Subject to any disclaimer, the term of this patent is extended or adjusted under 35 U.S.C. 154(b) by 0 days.

(21) Appl. No.: 13/324,601

(22) Filed: Dec. 13, 2011

Related U.S. Application Data (60) Provisional application No. 61/424,912, filed on Dec. 20, 2010.

(51) Int. Cl.
*H01L 29/15* (2006.01)
*H01L 29/80* (2006.01)
*H01L 29/66* (2006.01)

(52) U.S. Cl.
USPC ............ 257/77; 257/256; 257/263; 257/266; 257/267; 257/E21.409

(58) Field of Classification Search
USPC .......... 257/77, 498, 170, 600, 618, 623–625, 257/E31.072; 438/186, 39, 40, 164, 343, 438/412, 194, 217, 231, 232, 289, 306, 371, 438/37, 2, 495, 499, 505, 506, 508, 518, 438/524, 527, 531, 546, 551, 552
See application file for complete search history.

(56) References Cited

U.S. PATENT DOCUMENTS

| 3,828,230 A | 8/1974 | Nishizawa et al. |
| 4,037,245 A | 7/1977 | Ferro |
| 4,160,259 A | 7/1979 | Nishizawa |

(Continued)

FOREIGN PATENT DOCUMENTS

| EP | 1705711 A1 | 9/2006 |
| WO | 2009137578 A2 | 11/2009 |

OTHER PUBLICATIONS

Merrett, J.N. et al., "RF and DC Characterization of Self-aligned L-band 4H-SiC Static Induction Transistors," Materials Science Forum vols. 527-529, 2006, pp. 1223-1226.

(Continued)

*Primary Examiner* — Julio J Maldonado
*Assistant Examiner* — Cory Eskridge
(74) *Attorney, Agent, or Firm* — Marger Johnson & McCollom, P.C.

(57) ABSTRACT

A vertical-sidewall dual-mesa static induction transistor (SIT) structure includes a silicon carbide substrate having a layer arrangement formed thereon. Laterally spaced ion implanted gate regions are defined in the layer arrangement. Source regions are defined in the layer arrangement. Each of the source regions can include a channel mesa having a source mesa disposed thereon. The source mesa includes upright sidewalls relative to a principal plane of the substrate defining a horizontal dimension thereof. The channel mesa includes upright sidewalls relative to the source mesa and the principal plane of the substrate. Also disclosed is a method of fabricating a vertical-sidewall dual-mesa SiC transistor device. The method includes implanting ions at an angle relative to a principal plane of the substrate to form gate junctions in upper portions of the substrate and lateral portions of the upright channel mesas.

12 Claims, 4 Drawing Sheets

After contact via etch, ohmic contact formation and gate overlay metal patterning.

(56) References Cited

U.S. PATENT DOCUMENTS

| | | | |
|---|---|---|---|
| 4,199,771 | A | 4/1980 | Nishizawa et al. |
| 4,476,622 | A | 10/1984 | Cogan |
| 4,713,358 | A | 12/1987 | Bulat et al. |
| 5,612,547 | A | 3/1997 | Clarke et al. |
| 5,663,582 | A | 9/1997 | Nishizawa et al. |
| 5,686,330 | A | 11/1997 | Farb et al. |
| 5,705,830 | A * | 1/1998 | Siergiej et al. ............... 257/77 |
| 5,747,831 | A | 5/1998 | Loose et al. |
| 5,903,020 | A | 5/1999 | Siergiej et al. |
| 5,945,701 | A | 8/1999 | Siergiej et al. |
| 6,211,550 | B1 | 4/2001 | Grebs et al. |
| 7,294,860 | B2 | 11/2007 | Mazzola et al. |
| 7,547,586 | B2 | 6/2009 | Chen |
| 7,825,487 | B2 | 11/2010 | Veliadis et al. |
| 2006/0071217 | A1 | 4/2006 | Ohyanagi et al. |
| 2007/0281406 | A1 | 12/2007 | Chen |
| 2008/0093637 | A1 | 4/2008 | Sankin et al. |
| 2008/0124853 | A1 | 5/2008 | Cheng et al. |
| 2009/0278137 | A1 | 11/2009 | Sheridan et al. |
| 2009/0278177 | A1 | 11/2009 | Sankin et al. |
| 2010/0148224 | A1 * | 6/2010 | Zhao ............................ 257/263 |
| 2011/0049532 | A1 * | 3/2011 | Odekirk et al. ............... 257/77 |
| 2012/0161208 | A1 * | 6/2012 | Veliadis ....................... 257/265 |

OTHER PUBLICATIONS

Sankin, I, et al., "Normally-Off SiC VJFETs for 800 V and 120 V Power Switching Applications," Proceedings of the 20th International Symposium on Power Semiconductor Devices & IC's, May 18-22, 2008, Orlando, FL.

Nishizawa, Jun-ichi, et al., The 2.45 GHz 36 W CW Si Recessed Gate Type SIT with High Gain and High Voltage Operation, IEEE Ted vol. 47, No. 2, pp. 482-487, Feb. 2000.

Zhao, J.H., et al., 3.6m Ωcm2, 1726V 4H-SiC normally-off trenched-and-implanted vertical JFETs and circuit applications, IEEE Proceedings: Circuits Devices and Systems, Stenvenage, GB, vol. 151, No. 3, May 21, 2004, pp. 231-237; XP006021940 ISSN: 1350-2409.

* cited by examiner

FIG. 1
(PRIOR ART)

FIG. 2. SiC epi wafer after implant mask layer 1 deposition and source mesa photo patterning.

FIG. 3. After source mesa etch.

FIG. 4. After implant mask layer 2 deposition and channel mesa hard mask patterning for vertical mesa etch.

FIG. 5. After vertical channel mesa etch.

FIG. 6. Angled acceptor ion implantation to form P-type gate junctions and P+ guard rings.

FIG. 6a. Angled acceptor ion implantation to form P-type gate junctions and P+ guard rings.

FIG. 7. After implant anneal, BPSG deposition and reflow.

FIG. 8. After contact via etch, ohmic contact formation and gate overlay metal patterning.

FIG. 9. Completed

SILICON CARBIDE VERTICAL-SIDEWALL DUAL-MESA STATIC INDUCTION TRANSISTOR

CROSS REFERENCE TO RELATED APPLICATION

This application claims the benefit of copending U.S. Application Ser. No. 61/424,912, filed Dec. 20, 2010, incorporated by reference herein.

BACKGROUND

1. Technical Field

The present invention relates to the fabrication of semiconductor devices in high band gap materials such as silicon carbide, and more particularly to the fabrication of vertical-sidewall dual-mesa static induction transistors.

2. Discussion of Related Art

Silicon carbide (SiC) Static Induction Transistors (SITs) have been developed for high power radio frequency (RF) applications such as Radar, Avionics and TV Transmission. Such devices are described in U.S. Pat. Nos. 5,705,830 and 5,903,020. The conventional devices have been limited in frequency range thus far to high frequency (HF) in the range of 100-200 MHz and ultrahigh frequency (UHF) in the range of 400-500 MHz for the various applications due to excessive power gain roll-off at frequencies above 500 MHz.

There are many important applications for Radar and Avionics RF power transistors in L-Band (1.0-1.5 GHz) for which the conventional devices can not address. Consequently, high power L-Band Radar/Avionics systems are forced to use existing silicon bipolar devices that have much lower power densities, require lower operating voltages, and have significant temperature limitations.

It would therefore be desirable to use SiC SIT devices that operate at significantly higher voltages, power densities, and junction temperatures than existing silicon devices in L-Band systems. Performance advantages of SiC devices over silicon devices are made possible by the fundamental material properties of SiC. For instance, higher voltage operation with lower on-resistance arises from the 10× higher breakdown field strength of SiC compared to silicon. Higher junction temperature operation arises from the much larger bandgap (3.26 eV for 4H SiC, compared to 1.1 eV for silicon). Nevertheless, conventional SiC devices suffer from various inefficiencies.

U.S. Pat. No. 5,705,830 describes a conventional SiC SIT having a vertical conducting channel that uses Schottky barrier gate control. The source contact is on a narrow top mesa, the drain contact is on the back of the die, and the Schottky gate contact is formed on the sidewalls of a channel mesa. The requirement of making Schottky contact to the channel mesa vertical sidewalls imposes severe manufacturing difficulties, which are overcome only by use of several layers of e-beam lithography and precise angled metal evaporation and lift-off. Consequently the manufacture of such devices requires very expensive equipment and considerable engineering supervision. In addition, the Schottky gate has poor breakdown and reverse leakage characteristics resulting in reliability problems that are difficult to overcome.

An improvement over the Schottky gated SIT is described in U.S. Pat. No. 5,903,020. In the '020 patent, a single-mesa is used and the Schottky barrier gate is replaced by a junction gate. The junction gate is formed by implanting acceptor impurities, typically aluminum (Al), into the gate region using the channel mesa, with oxide sidewall spacers as the implant mask. Hence, the p-type gate is self-aligned to the n-type vertical channel. This is simpler to manufacture using conventional optical stepper lithography, and no metal contacts need to be made to the sidewall of the channel mesa.

In addition, the junction gate of the '020 patent has a larger barrier height (~3.0 eV compared to ~1.4 eV for the Schottky gate), which enables wider channel mesas to be formed for the same channel pinch-off voltage, $V_P$. Because of the larger barrier height, the junction gate has a higher gate turn-on voltage (~2.5 V) than the Schottky gate (~1.0 V), which provides substantially higher maximum channel current (and hence, power) capability. Moreover, the junction gate has higher breakdown voltage and lower reverse bias gate leakage, making a more robust and reliable device.

As a result, the single-mesa implanted junction-gated SIT provides a robust RF power transistor for applications through UHF band. Indeed, these devices have produced the highest power UHF transistors available to date.

Figure 1:
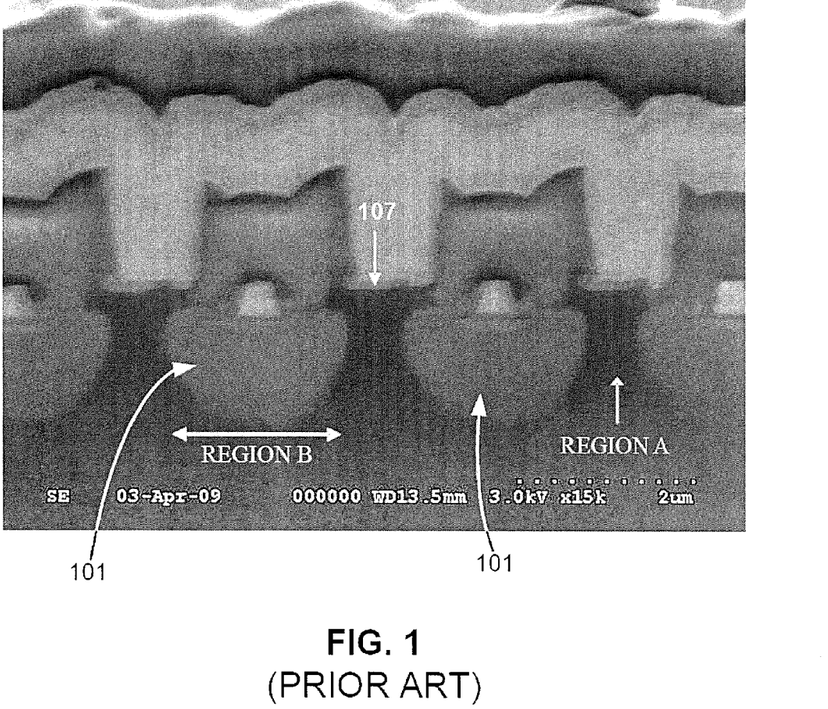
FIG. 1 is a cross-sectional view showing a conventional single-mesa implanted SIT for UHF power transistors.

FIG. 1 shows an SEM image of a cross section of the conventional single-mesa implanted SiC SIT for UHF power transistors. The p-type (implanted) regions 101 show up as lighter regions in these SEM images. The source contacts are on top of the single-mesa as indicated by 107 in FIG. 1, and the drain contact is on the back of the chip (not shown). Hence, the single-mesa structure forms both the source contact and the vertical transistor channel, and current flow is modulated by voltage applied to the gate and drain contacts.

Several frequency-limiting factors are inherent to the conventional single-mesa topology. The gate junction is formed by implantation directed normally to the wafer surface at high energy. Consequently, and as shown in FIG. 1, the gate perimeter is defined by the lateral and side straggle of the highest energy implant and the resulting channel has a trapezoidal shape, as shown in Region A. An ideal channel would be of constant width throughout the length of the channel. The channel widening from the source to drain end shown in FIG. 1 reduces the gate control of channel current, which is particularly detrimental to high frequency performance. In addition, the extended perimeter of the gate junction in Region B of FIG. 1 contributes excess parasitic gate capacitance ($C_{gg}$) that further reduces the high frequency capability.

DETAILED DESCRIPTION

FIGS. 2 through 8 are cross-sectional views of a vertical-sidewall dual-mesa silicon carbide (SiC) Static Induction Transistor (SIT) at various steps in the manufacturing process.

Figure 9:
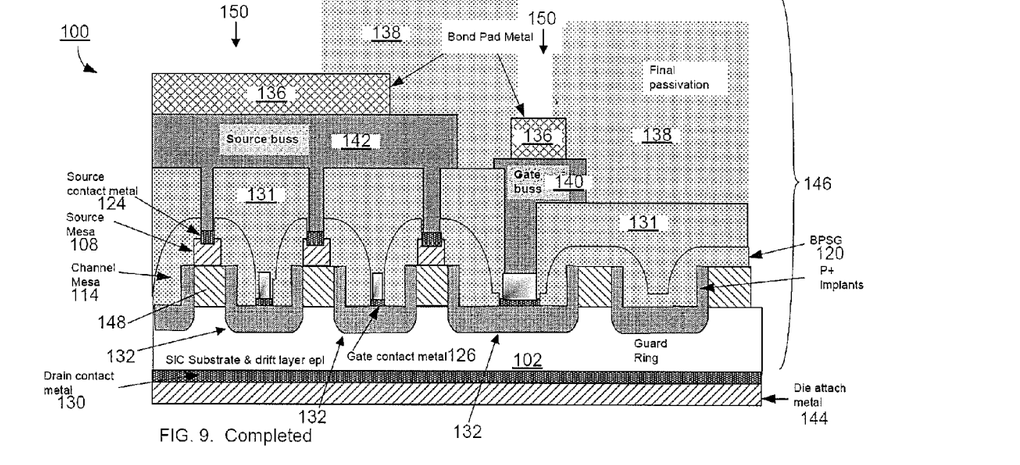
FIG. 9 shows the completed vertical-sidewall dual-mesa SiC SIT according to embodiments of the present invention.

FIG. 9 shows the completed vertical-sidewall dual-mesa SiC SIT according to embodiments of the present invention. Regions and elements are referenced using consistent numerals throughout. The drawings included herein are not necessarily to scale.

The preferred first embodiment of the present invention includes a method of fabricating the SiC SIT as described with reference to FIGS. 2 through 7. A vertical-sidewall dual-mesa SIT is described in which a channel mesa is formed with vertical sidewalls. A source mesa is disposed on the channel mesa. The source mesa sidewalls are recessed laterally relative to the sidewalls of the channel mesa. It should be understood that the inventive principles disclosed herein are not limited to the methods for manufacturing the improved SiC SIT illustrated and described, except as specifically limited in the claims. Rather, the inventive principles disclosed herein may be extended to other embodiments, such as equivalent methods for achieving the same or similar structures.

Although various parameters are described herein associated with the various described fabrication steps (i.e., parameters such as lengths of time, temperatures, implant doses and energies, the thickness or depth of various portions of the semiconductor devices, and ranges of chemical compositions in compounds), it will be understood that the parameters described herein are associated merely with particular embodiments of the present invention, and therefore not limiting of the invention except where expressly claimed.

Figure 2:
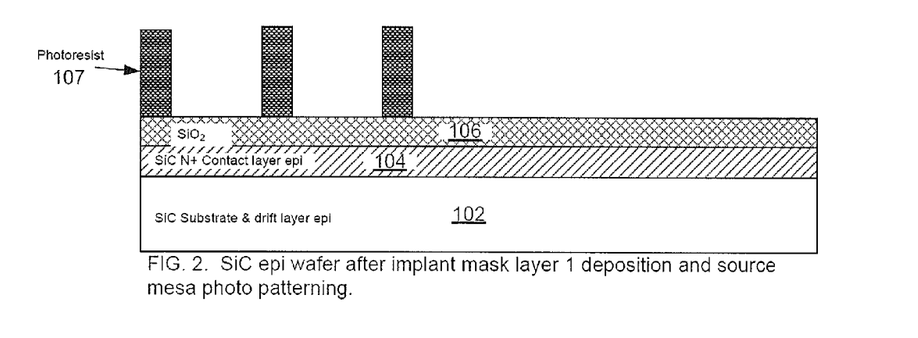
FIGS. 2 through 8 show cross-sections of a vertical-sidewall dual-mesa silicon carbide static induction transistor (dual-mesa SiC SIT) through various stages of fabrication, according to embodiments of the present invention.

FIG. 2 shows the fabrication of this structure in the initial stages. A SiC substrate 102, with epitaxial layers disposed thereon to define the drift region and the channel region, comprises layer 102, capped with a highly doped source contact layer 104. The SiC substrate is typically 4H polytype, but may also be 6H, 3C, or any other suitable polytype of SiC. The substrate layer 102 is preferably n-type with a resistivity less than 0.10 ohm-cm.

A buffer layer may be grown on the substrate wafer prior to drift layer growth. This buffer layer is n-type with a typical donor concentration of $5 \times 10^{17}$ to $1 \times 10^{19}$ cm$^{-3}$, and a thickness of between 0.25 and 1.0 µm. A lower doped n-type drift layer is then grown on the buffer layer to provide the desired transistor blocking voltage level. Donor concentrations for the drift layer are preferably $1 \times 10^{15}$ to $1 \times 10^{17}$ cm$^{-3}$. Drift layer thickness may be in the range 1 to 15 µm. After the drift layer is grown, an optional n-type channel layer can be grown thereon to provide efficient channel conduction characteristics. The channel layer doping is typically in the range $1 \times 10^{16}$ to $5 \times 10^{17}$ cm$^{-3}$, with a thickness in the range of 0.5 to 5 p.m. These layers together, i.e., the SiC substrate, the buffer epi layer, the drift epi layer, and the channel epi layer, correspond to substrate layer 102.

On top of layer 102 is formed a highly doped n-type layer 104 to facilitate formation of source ohmic contacts. This layer can be epitaxially grown or formed by ion implantation of suitable donor species (e.g., such as nitrogen or phosphorous). The donor concentration in this layer can be in the range of $1 \times 10^{18}$ to $2 \times 10^{19}$ cm$^{-3}$, with a thickness in the range of 0.1 to 0.5 p.m. Layer 106 is a deposited dielectric film suitable for use as an ion implantation mask for implanting at wafer temperatures above, for example, 400° C. The film 106 can be silicon dioxide, silicon nitride, or silicon oxynitride deposited by thermal CVD or plasma enhanced CVD. In a preferred embodiment, the film 106 is silicon dioxide (SiO$_2$) deposited by plasma-enhanced chemical vapor deposition (PE-CVD) to a thickness in the range of 0.3-1.0 µm. Photoresist patterning 107 is disposed on the film 106 in preparation of reactive ion etching of the SiO$_2$ layer 106 and the SiC source contact layer 104.

Figure 3:
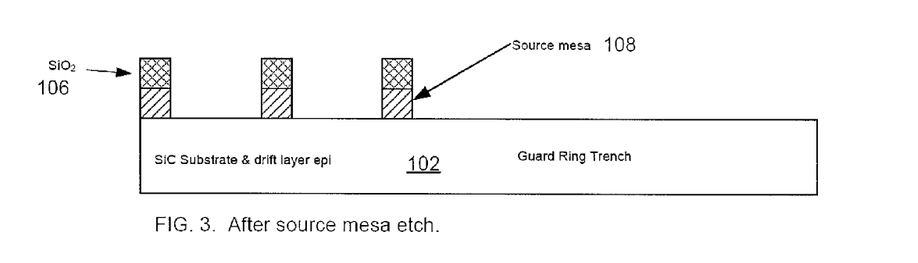

Referring to FIG. 3, a source mesa 108 is formed by conventional photoresist patterning and reactive ion etching of the SiO$_2$ layer 106 and the SiC source contact layer 104, resulting in source contact mesas 108 shown in FIG. 3. The reactive ion etching (RIE) in our embodiment uses sulfur hexafluoride (SF6) or nitrogen trifluoride (NF$_3$), but any fluorine-containing etch gas may be used to etch both layers.

Alternatively, a metal etch mask can be used to reduce any slope to the source mesa sidewalls. When the metal etch mask is used, a nickel (Ni) or aluminum (Al) film is patterned over the top of the intended source mesa region by photolithography and lift-off. The resulting source mesa 108 sidewall is upright, and can have a rectangular or trapezoidal shape. For example, the slope of the sidewalls of the source mesa 108 is shown as vertical, and is sometimes referred to herein as vertical, but can be in the range of 0 to 15 degrees. The source mesa etch is made deeper than the highly doped source contact layer 104 in order to establish adequate gate/source breakdown voltage. The source mesa 108 can be etched between 0.1 and 0.5 µm below the lower surface of layer 104 into layer 102; hence, although not shown, the source mesa 108 includes the high doped contact region overlying a portion of the medium doped channel region.

Figure 4:
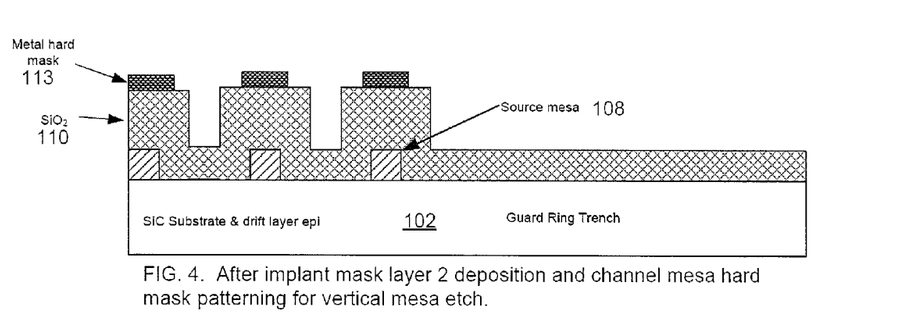
Figure 5:
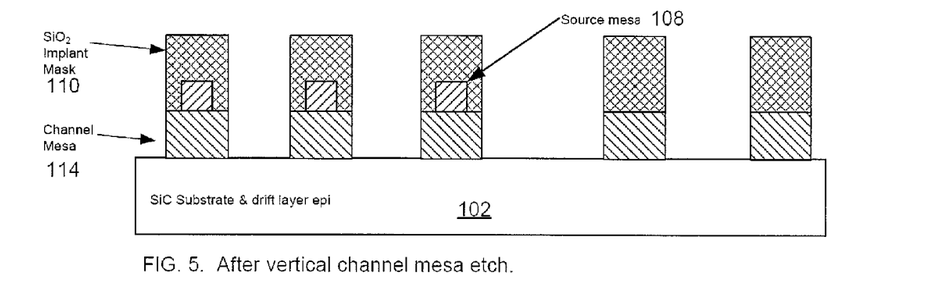

After source mesa etching is complete, a second dielectric implant mask layer 110 as shown in FIG. 4 is deposited over the initial implant mask layer 106 in order to provide adequate implant blocking as well as to provide a sidewall spacer for the source mesa 108. Subsequent to the source mesa etching and the second implant mask deposition, a metal hard mask pattern 113 is disposed on the second implant mask deposition layer 110 as shown in FIG. 4, and patterned photolithographically. Reactive ion etching (RIE) is then used to pattern and etch the vertical-sidewall channel mesa 114 as shown in FIG. 5. Use of a hard metal etch mask such as Ni or Al enable substantially vertical etching of the SiC.

The patterning and etching can result, for example, in stripe-shaped trenches between the channel mesas 114. Etching is again done using RIE with fluorine-containing etch gases. The metal mask etch characteristics are set to provide vertical or substantially vertical sidewalls of the channel mesa. In other words, a trench is formed between adjacent mesas with upright sidewalls. Each mesa between two trenches thus has a rectangular shape.

Figure 6:
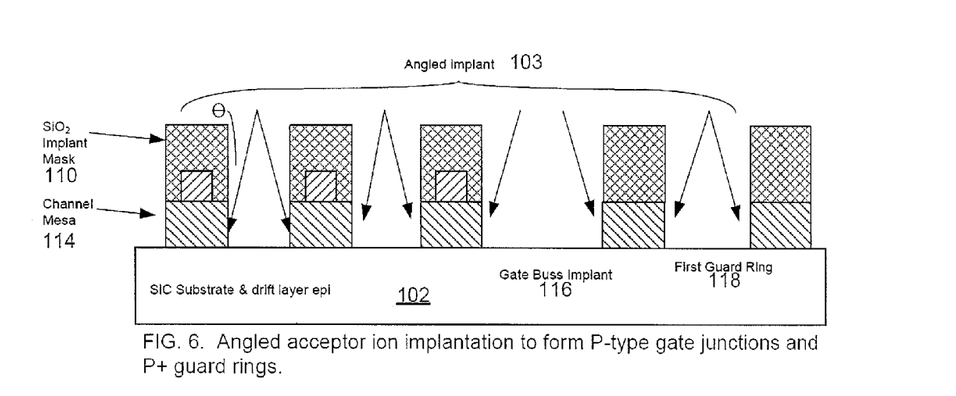
Figure 6A:
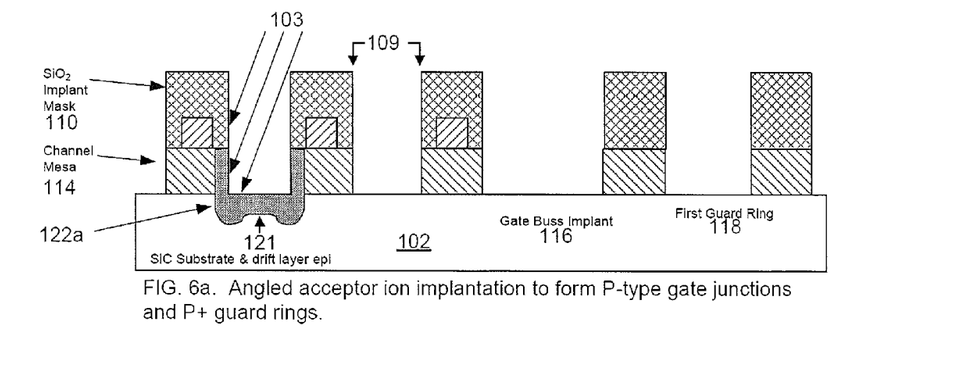
Figure 7:
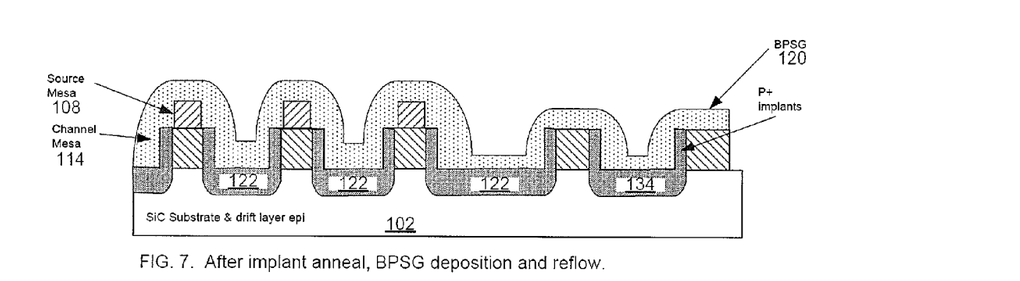

FIG. 6 depicts an example embodiment of the acceptor ion angled implant step 103 used to form the gate junction. FIG. 6a shows further details of the angled implantation into the channel mesas and gaps between them according to some embodiments of the present invention. FIG. 7 shows another embodiment of the formed gate junction. The following description proceeds with reference to FIGS. 6, 6a, and 7. The vertical channel mesa sidewalls 114 are implanted with one or more angled implants 103. In some embodiments of the present invention, ions are implanted in the channel mesa 114 at an acute angle θ relative to the sidewalls of the channel mesa 114. The angled implantation can be accomplished by either tilting the wafer 102 itself using a shim (not shown) or other suitable tilting device so that the ion implantation is received at the acute angle θ relative to the sidewalls of the channel mesa 114. Alternatively, the wafer 102 can be maintained in a horizontal position and the ion implant itself can be slanted relative to the sidewalls of the channel mesa 114 so that the ion implant is received at the acute angle θ relative to the sidewalls of the channel mesa 114. The implant energy is kept below the energy at which the implant would penetrate through the spacer oxide 110.

It is well-known that ion implantation damage in SiC is very difficult to eliminate unless the implantation is done at an elevated wafer temperature. In our preferred embodiment, ion implantation is done at 600° C., but it can be done at any temperature above ~400° C. Acceptor ion species can be aluminum (Al) or boron (B). In our preferred embodiment, Al ions are implanted in the energy range 20-120 keV and with a dose in the range $10^{14}$ to $10^{16}$ cm$^{-2}$.

FIG. 6a shows further details of the angled implantation into the channel mesas through the gaps between them according to some embodiments of the present invention. In FIG. 6a, gate implants or junctions 122a are preferentially formed on each sidewall of the channel mesa 114 and lower edge portions thereof, and can include a relatively shallow implant region 121 in substrate 102 formed as a result of blockage of some of the acceptor ions during the angled implant step 103. The implant region 121 is continuous between the opposed lower edge portions of the gate junction 122a, and is located in a central portion between the channel mesas 114. The depth of the region 121 is a function of the dimensional features and aspect ratio of the surrounding structures and/or the implant angle θ.

For instance, the height of the channel mesa 114, the thickness of the implant mask layer 110, the width of the gap 109 between the structures, and/or the angle of implantation can affect the depth of the region 121 and the depth and distribution of the gate junction 122a. It should be understood that the aspect ratio and sizes of the structures as illustrated in FIG. 6a and other figures are not necessarily drawn to scale, but are instead presented as exemplary structures to convey inventive principles as described herein. In an example embodiment, the combined height of the channel mesa 114 and the implant mask layer 110 is 2 microns or thereabout, and the width of the gap 109 is between 1 and 1.5 microns, or thereabout. The angle of implantation can be any suitable angle, but is preferably 15 degrees or thereabout.

The angled ion implant results in beneficial and desirable structural features of the gate junction 122a. For example, as the gate junction 122a includes portions 121 that receive reduced ion implantation, such gate junction configuration results in a preferential reduction of parasitic gate capacitance, and/or a reduction in channel length or depth. While gate junction 122a includes shallow region 121, it should be understood that the gate junction need not necessarily include the shallow region, and in some embodiments, the gate junction can have a substantially even depth that is proportional to the depth of the lower edge portions of the gate junction.

In addition to forming the gate junctions 122a, the acceptor implants also form a junction extension in region 116, and guard rings in region 118 to enable high blocking voltages. If deeper junction regions are desired in structures 116 and 118, these can be patterned and implanted separately. Subsequently, the implant mask films are removed from the wafer by wet etching and the wafer is annealed in argon (Ar) at 1675° C. The implant anneal can be performed at any temperature above ~1500° C.

Referencing FIG. 7, after implant anneal, a surface passivation film 120 is formed on the wafer, that is, on the source mesas 108, channel mesas 114, gate junctions 122 and one or more P+ guard ring structures 134. While the gate junction 122 of FIG. 7 spans the entire width between channels at a relatively even depth, it should be understood that the abbreviated gate junction 122a as shown in FIG. 6a can be associated with any of the various embodiments described herein. In the embodiment depicted in FIG. 7, the film 120 consists of or includes plasma-enhanced chemical vapor deposition borophosphosilicate glass (PE-CVD BPSG), which is flowed to provide good step overage over the dual-mesa stack 108/114. Any conventional dielectric film such as silicon dioxide, silicon oxynitride or silicon nitride can also be used as the surface passivation layer.

The implanted p-type gate junctions 122 formed by the implant and anneal steps then define the transistor channel length (i.e., in the vertical direction from channel mesa top to the bottom of the implant junction) and the channel width (i.e., the horizontal distance between p-type regions 122 at the bottom of the channel mesa). The channel length so defined determines the transconductance ($g_m$) of the transistor, and the channel length and channel width together determine the $V_P$ of the transistor. The total gate capacitance ($C_{gg}$) is determined by the perimeter length of the p-type gate region, and includes intrinsic gate capacitance in the vertical direction of the channel mesa and extrinsic 'parasitic' gate capacitance in the horizontal direction between channel mesas. The transistor cutoff frequency, $f_t$, depends on the ratio: $g_m/C_{gg}$. Therefore, it is beneficial to minimize $C_{gg}$ and maximize $g_m$ to achieve desired high-frequency power amplification.

In some embodiments of the present invention, the channel length is determined by channel mesa etch depth and implant energy. Both of these are easily controlled in a production environment. The manufacturability enhancements associated with embodiments of this invention make possible repeatable fabrication of such devices. The use of lower energy implants for this dual-mesa SIT (e.g., ~30-50 keV in the preferred embodiment) compared to the typical 175 keV used in the single-mesa SIT significantly reduces the extension of the gate junction in the parasitic region, which in turn reduces the parasitic gate capacitance.

Figure 8:
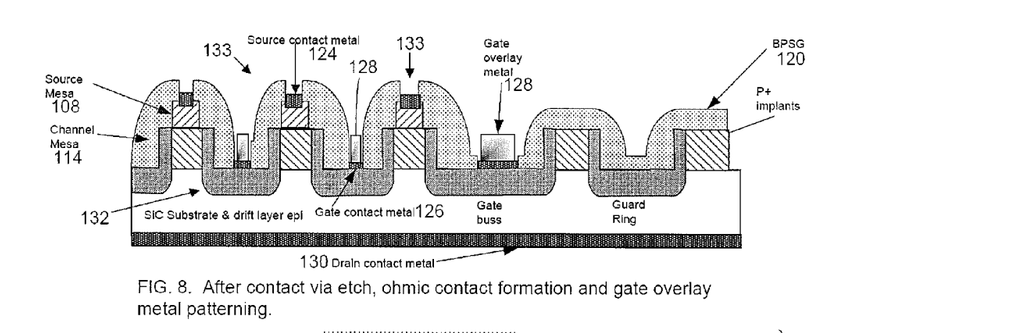

Referencing FIG. 8, ohmic contacts 130 are applied to the back of the wafer to form the drain contact 130. Photolithography and RIE are used to form openings for the source ohmic contacts 124 associated with the source regions 133, and the gate ohmic contacts 126 associated with the gate regions 132. Each of the source ohmic contacts 124 is coupled to a corresponding one of the source mesas 108. Similarly, each of the gate ohmic contacts 126 is coupled to a corresponding one of the gate junctions 122.

The ohmic contacts can be formed by alloying a thin Ni film having, for example, a thickness of 500-1000 angstroms, with the SiC to form $Ni_2Si$. The Ni film is most typically patterned in the contact openings by lift-off. The anneal process used to form the $Ni_2Si$ ohmic contact can include any number of steps, and generally includes a final anneal at 850-1000° C. All of the ohmic contact regions can be formed together.

After the ohmic contacts are formed, gate overlay metal 128, which can consist of or include titanium (Ti), platinum (Pt) and/or gold Au, is patterned by lift-off on each of the gate ohmic contacts 126. The gate overlay metal is used to reduce the metal resistance along the gate finger, since the gate fingers are connected together by a gate bus at the ends of the fingers, as further described below.

The completed device is depicted in FIG. 9. The completed device 100 includes a silicon carbide substrate 102 having a layer arrangement 146 formed thereon. After the ohmic contacts 124/126 and gate overlay metal 128 are formed (for example, as described with reference to FIG. 8), an interlayer dielectric film 131 is deposited by PE-CVD on the passivation film 120, the ohmic contacts, and the gate overlay metal. This film is typically silicon dioxide, with a thickness of about 1.0 μm. Other dielectric films can be used such as silicon oxynitride or silicon nitride; however, it is desirable to minimize the coupling capacitance between the source metal bus 142 and the gate finger regions 132 through the use of the lower dielectric constant material $SiO_2$. Source contact openings are subsequently patterned and etched using RIE and the source fingers are interconnected through the metal bus 142 using tungsten deposited by CVD. Each of the source regions 133 can be communicatively coupled to the common source bus 142 through each source mesa 108, respectively.

Chemical vapor deposited tungsten (CVD-W) is the preferred source metal interconnect material for two reasons.

First, the CVD-W process completely fills the source contact via, which is at or about 0.6 μm in width and at or about 1.0 μm in depth. Second, W has a thermal expansion coefficient (~4.5) closely matched to that of SiC (~6.0), which leads to enhanced reliability under RF power cycling. To facilitate the CVD-W process and to further improve reliability, a barrier metal can be deposited prior to the W deposition. This barrier metal is preferably composed of TiN, TiW, TiWN and/or TiWON, or any combination thereof.

As mentioned above, gate overlay metal 128 is used to reduce the metal resistance along the gate finger, and the gate fingers are connected together by a gate bus 140 at the ends of the fingers. Before forming the gate bus 140, gate contact openings are patterned and etched in the interlayer dielectric film 131 using RIE, and thereafter, the metal gate bus 140 is formed; as a result, the gate regions are interconnected through the metal gate bus 140.

After the formation of the source bus 142 and the gate bus 140, source and/or gate bond pads 136 are deposited by liftoff on the source bus 142 and the gate bus 140, respectively. The source and gate bond pads 136 are preferably metal such as Ti, Pt and/or Au, but can be any metal stack suitable for gold wire bonding. A final passivation layer 138 preferably consisting of or including silicon oxynitride having a thickness of at or about 1.0 μm is then deposited, and bond pad openings 150 are patterned and etched using conventional RIE. Thereafter, backside metal 144 suitable for die attach can be deposited. The backside metal 144 can consist of or include a deposited silicon layer for Au/Si eutectic die attach, Ti/Pt/Au, Ti/Ni/Ag or any conventional die attach metal.

As mentioned above, an ideal channel would be of constant width throughout the length of the channel. The source regions 133 include one or more channels 148 having a constant width or a substantially constant width W from the top of the channel mesa 114 to the bottom of the channel mesa 114. In other words, channel mesas 114 are formed between trenches patterned in the substrate 102. The channel mesas 114 are formed to have upright sidewalls defining a rectangular cross section thereof. A source mesa 108 is disposed atop each of the channel mesas 114. The source mesa 108 has sidewalls recessed laterally relative to the sidewalls of the channel mesa 114. A channel 148 is formed in the channel mesa 114 by ion implantation, forming doped regions 132 that extend into the channel mesa 114 through the upright sidewalls so as to define a substantially rectangular channel 148 between the sidewalls of the channel mesa 114.

The large-signal power performance of SIT devices is implied by the transistor pinch voltage ($V_P$). Low $V_P$ devices exhibit high blocking voltage gain and thus, the possibility of high power gain when transistor transconductance, $g_m$, is optimized.

Nevertheless, low $V_P$ devices suffer suppressed maximum available current swing in large-signal operations when the gate is moderately turned on as a result of the RF input power. Consequently, low $V_P$ devices exhibit limited transistor power delivering capability as indicated by low power at one decibel gain compression ($P_{1dB}$) due to the suppression of the transistor current swing.

In general, transistor frequency performance is optimized by engineering the cutoff frequency, $f_t$. Transistor $f_t$ is a function of $g_m$ as well as gate parasitic capacitance (both gate/source and gate/drain junctions). In order to raise SIT switching speed and broaden the spectrum of applications, transistor $g_m$ is optimized while gate capacitance is minimized.

In prior art single-mesa SIT architectures, transistor $V_P$ is adjusted solely by the gate implant for a given epitaxial structure. Therefore, $V_P$ targeting in the manufacturing process and transistor small-signal performance are coupled, thereby making it difficult to simultaneously optimize DC, large- and small-signal RF performance.

In other approaches, where the gate is formed by a Schottky metallization instead of acceptor implantation, $V_P$ targeting in the manufacturing process is set by the channel mesa width alone for a given gate metal and epitaxial structure. This poses a severe constraint on the final channel mesa width, which translates into limitations in manufacturability. The selection of gate Schottky metal to increase the Schottky junction width is of limited value in terms of relaxing process requirements on the final channel mesa width. The gate junction implant provides significantly greater degree of flexibility, and therefore manufacturability, in the channel mesa formation process.

The vertical-sidewall dual-mesa SIT architecture, embodiments of which are disclosed herein, has significant performance advantages. For example, in contrast with the single-mesa architecture, the transistor channel length of the dual-mesa SIT can be easily set by channel mesa height. The dual-mesa SIT structure also enables sub-micron transistor channel length with optimized transconductance and minimized gate parasitic capacitance without requiring sub-micron lithography. Moreover, $V_P$ is set by both the channel mesa structure and the gate implant, reducing the coupling of $V_P$ targeting and transistor channel length. This allows more independent control of DC, large-signal and small-signal RF performance, thereby leading to higher performance and greater manufacturability.

Moreover, for a given transistor pinch voltage, the vertical-sidewall dual-mesa architecture exhibits much higher transistor blocking voltage gain. Together with the high $g_m$ and low parasitic capacitance, this enables higher frequency RF power performance. In addition, due to the high blocking voltage gain intrinsic to the dual-mesa architecture: (a) limitation of power gain as a result of $g_m$ (channel length) is lessened, and (b) $V_P$ can be higher for a given power gain requirement and therefore, channel mesa width can be increased, which translates into improved manufacturability.

Having described and illustrated the principles of the invention in various embodiments thereof, it should be apparent that the invention can be modified in arrangement and detail without departing from such principles. I claim all modifications and variations coming within the spirit and scope of the following claims.

The invention claimed is:

1. A static induction transistor structure, comprising:
   a silicon carbide substrate having a layer arrangement formed thereon;
   a plurality of laterally spaced ion implanted gate regions defined in the layer arrangement; and
   a plurality of source regions defined in the layer arrangement, each of the plurality of source regions being positioned adjacent to respective ones of the gate regions,
   wherein:
   each of the source regions includes a first mesa having a second mesa disposed thereon;
   the second mesa includes upright sidewalls relative to a principal plane of the substrate, the principal plane of the substrate defining a horizontal dimension thereof; and
   the first mesa includes upright sidewalls relative to the principal plane of the substrate.

2. The static induction transistor structure of claim 1, wherein at least one of the plurality of source regions further includes a channel having a substantially constant width (W) relative to the upright sidewalls.

3. The static induction transistor structure of claim 1, wherein the second mesa for each source region is a source mesa coupled to a source contact.

4. The static induction transistor structure of claim 1, wherein the second mesa includes sidewalls that are recessed laterally relative to sidewalls of the first mesa.

5. The static induction transistor structure of claim 3, wherein each of the plurality of source regions is communicatively coupled to a source bus through each source mesa.

6. The static induction transistor structure of claim 1, further comprising a source ohmic contact coupled to the second mesa.

7. The static induction transistor structure of claim 6, further comprising a source bus coupled to the second mesa via the source ohmic contact.

8. The static induction transistor structure of claim 7, further comprising an interlayer dielectric film disposed on a passivation film and between the source bus and the plurality of gate regions.

9. The static induction transistor structure of claim 7, further comprising a source bond pad formed on the source bus.

10. The static induction transistor structure of claim 9, further comprising a passivation layer on the source bond pad, wherein the passivation layer includes one or more bond pad openings formed therein.

11. The static induction transistor structure of claim 1, further comprising ohmic contacts coupled to a bottom surface of the substrate, and a backside metal coupled to the ohmic contacts.

12. A dual-mesa static induction transistor device, comprising:
   a silicon carbide substrate;
   first and second trenches defined in the substrate;
   a channel mesa disposed between the first and second trenches, the channel mesa having upright sidewalls defining a rectangular cross section thereof;
   a source mesa atop the channel mesa, the source mesa having sidewalls recessed laterally relative to the sidewalls of the channel mesa; and
   an ion implanted doped region extending into the channel mesa through the upright sidewalls so as to define a substantially rectangular channel between the sidewalls of the channel mesa.

\* \* \* \* \*